US006060779A

United States Patent [19]
Machii

[11] Patent Number: 6,060,779
[45] Date of Patent: May 9, 2000

[54] RESIN SEALED CERAMIC PACKAGE AND SEMICONDUCTOR DEVICE

[75] Inventor: Misuzu Machii, Nagano, Japan

[73] Assignee: Shinko Electric Industries, Co., Ltd., Nagano, Japan

[21] Appl. No.: 09/066,882

[22] Filed: Apr. 27, 1998

[51] Int. Cl.[7] .......... H01L 23/04
[52] U.S. Cl. .......... 257/730; 757/729
[58] Field of Search .......... 257/729, 787, 257/730

[56] References Cited

U.S. PATENT DOCUMENTS 4,796,083 1/1989 Cherukuri et al. .
5,055,911 10/1991 Ogata .

FOREIGN PATENT DOCUMENTS 61-292328 12/1986 Japan .

*Primary Examiner*—Sheila V. Clark
*Attorney, Agent, or Firm*—Pennie & Edmonds LLP

[57] ABSTRACT

A resin sealing ceramic package 10 for resin sealing of a semiconductor element 14 mounted in a cavity 16, the ceramic package having a bleed-out-preventing metal pattern 24, to prevent bleed-out of a sealing resin filled in the cavity 16 from out of the cavity, which comprises a metallized layer 26 made of tungsten formed in a frame-shape on the surface of the ceramic package 10 along the edges of the cavity 16, and a metal plating layer 32 consisting of a nickel layer 28 of at least 1.5 μm thickness and a gold layer 30 of at least 0.3 μm thickness formed on the metallized layer 26.

8 Claims, 4 Drawing Sheets

RESIN SEALED CERAMIC PACKAGE AND SEMICONDUCTOR DEVICE

BACKGROUND OF THE INVENTION

1. Field of the Invention

The present invention relates to a resin sealed ceramic package and to a semiconductor device and, more specifically, it relates to a resin sealed ceramic package for resin sealing of mounted semiconductor elements, and to a semiconductor device wherein a semiconductor element mounted on a ceramic package is resin sealed.

2. Description of the Related Art

Conventional ceramic package-mounted semiconductor elements have been hermetically sealed with metal caps and the like.

However, attempts have been made at resin sealing semiconductor elements mounted on ceramic packages in order to achieve lighter weight and a lower cost of the semiconductor devices. In particular, for semiconductor devices on which CCDs (Charge Coupled Devices) are mounted, when the CCD is hermetically sealed by a cap fitted with a glass section it has been extremely difficult to achieve perfect sealing between the cap and the glass section and between the cap end face and the ceramic package end face.

As shown in FIG. 10, a semi-transparent sealing resin 106 can be used for resin sealing of the CCD 104 mounted in a cavity 102 of the ceramic package 100.

As FIG. 10 shows, the resin sealing of the CCD 104 mounted in a cavity 102 of the ceramic package 100 using a sealing resin 106 allows the CCD to be more easily sealed than when the sealing of the CCD is accomplished with a cap fitted with a glass section, while the semiconductor device can also be made lighter than by using a glass-fitted cap.

However, when the sealing resin is filled into the cavity 102 by potting, etc. for resin sealing of the CCD 104 mounted in the cavity 102 of the ceramic package 100, it has been shown that bleed-out of the sealing resin occurs from the cavity 102 at the end face of the ceramic package 100. This bleed-out phenomenon is such that the sealing resin creeps up the walls of the cavity 102 and seep out at the end face of the ceramic package 100.

This sealing resin which has bled out from the end face of the ceramic package 100 is very difficult to remove completely even by washing.

For this reason, a frame-like ceramic barrier is provided along the edges of the cavity 102 of the ceramic package 100 to try to prevent bleed-out of the sealing resin due to the height of the barrier, or the amount of the sealing resin filling the cavity 102 is adjusted; however, even with these measures it has still not been possible to prevent the phenomenon of bleed-out of the sealing resin.

As a strategy for solving the above-mentioned problems of the prior art, Japanese Unexamined Patent Publication No. 61-292328 discloses provision of a resin flow control material layer made of silicon grease or silicon oil, instead of the aforementioned barrier, but this method has still been inadequate for preventing bleed-out of sealing resins.

SUMMARY OF THE INVENTION

It is therefore an object of the present invention to provide a resin sealing ceramic package, and a semiconductor device, in which bleed-out of sealing resins used for sealing of mounted semiconductor elements can be prevented.

As a result of research carried out to solve the aforementioned problems, the present inventors have completed the present invention upon finding that bleed-out of sealing resins can be prevented by forming a nickel-gold metal plating on a tungsten metallized layer formed in the shape of a frame on the surface of the ceramic package so as to surround the sealing resin area.

In other words, the present invention provides a resin sealing ceramic package which is a resin sealing ceramic package for resin sealing of mounted semiconductor elements, characterized in that a bleed-out-preventing metal pattern designed to prevent bleed-out of the sealing resin used for resin sealing from out of the resin sealing area, is formed on the surface of the ceramic package so as to surround the resin sealing area.

The present invention further provides a semiconductor device which is a semiconductor device wherein a semiconductor element mounted on a ceramic base is resin sealed, characterized in that a bleed-out-preventing metal pattern designed to prevent bleed-out of the sealing resin used for resin sealing from out of the resin sealing area, is formed on the surface of the ceramic package so as to surround the resin sealing area.

DESCRIPTION OF THE PREFERRED EMBODIMENTS

According to the present invention, it is possible to easily form a bleed-out-preventing metal pattern by forming a metal plating layer on a metallized layer surface made of a metal such as tungsten, which has been formed in the shape of a frame on the surface of a ceramic package, surrounding the resin sealing area. The metal plating layer is constructed from a nickel layer and a gold layer, with the thickness of the nickel layer being at least 1.5 $\mu$m and the thickness of the gold layer being at least 0.3 $\mu$m, to provide still greater improvement in the effect of preventing bleed-out of the sealing resin provided by the bleed-out-preventing metal pattern.

When a sealing resin is filled into the resin sealing area of a cavity, etc. of a fired ceramic package, the filled sealing resin bleeds out from the surface of the ceramic package through the cavity walls. In particular, there is often selective bleeding-out of the solvents of sealing resins which have been liquefied for potting. This bleed-out phenomenon is attributed to the fact that the surface of the fired ceramic package is rougher than the metal plate surface.

Here, with the resin sealing ceramic package of the present invention it is possible to prevent bleed-out of sealing resins used for resin sealing of mounted semiconductor elements, which occurs from the resin sealing area, by means of a bleed-out-preventing metal pattern formed surrounding the resin sealing area. Thus, for the first time it has become possible to industrially provide semiconductor devices with resin-sealed semiconductor elements mounted on ceramic packages.

Figure 1:
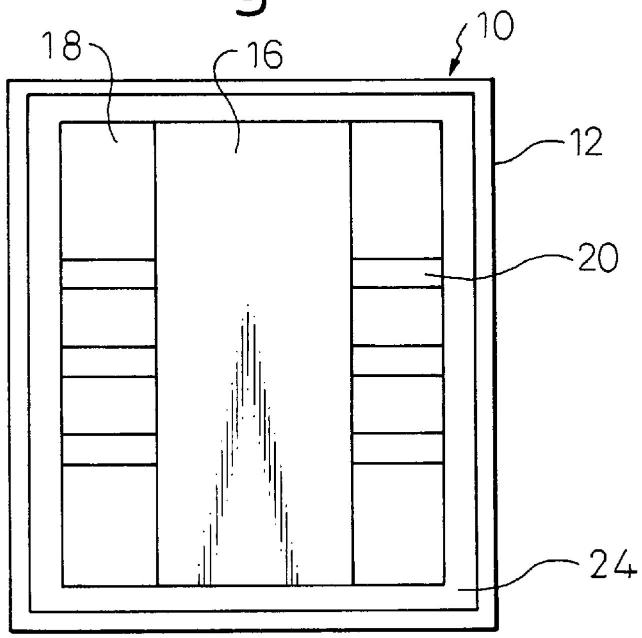
FIG. 1 is a plan view of an embodiment of a ceramic package according to the invention.
Figure 2:
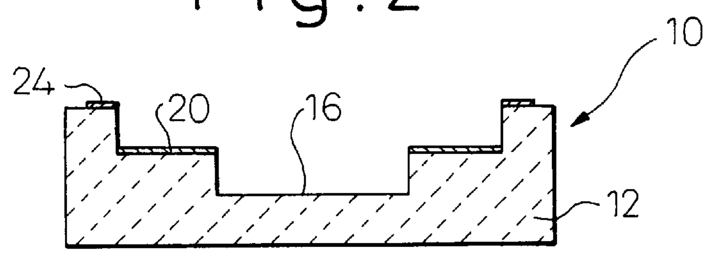
FIG. 2 is a cross-sectional view of the ceramic package of FIG. 1.

An embodiment of a resin sealing ceramic package according to the invention is shown in FIGS. 1 and 2. FIG. 1 is a plan view of the resin sealing ceramic package, and FIG. 2 is a cross-sectional view thereof.

The ceramic package 10 shown in FIGS. 1 and 2 has a ceramic package body 12, made of alumina ceramic, in which is formed a cavity 16 provided on the bottom of a CCD 14.

Figure 4:
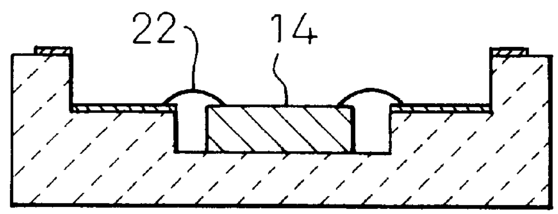
FIG. 4 is a cross-sectional view of an embodiment of a ceramic package according to the invention, with a CCD mounted thereon.

On the differential level sides 18 of the cavity 16 there are formed ends of a conductor pattern 20, which are bonded to the electrode terminal, by the bonding wires 22, 22 . . . , of the mounted CCD 14 (FIG. 4).

Figure 5:
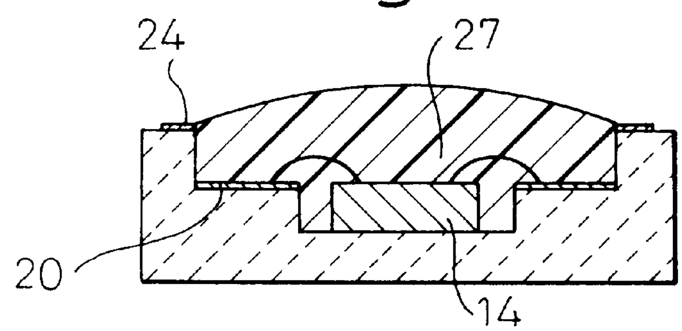
FIG. 5 is a cross-sectional view of an embodiment of a semiconductor device according to the invention.

This cavity 16 formed in the ceramic package body 12 is filled with a sealing resin for resin sealing (FIG. 5). The cavity 16 is therefore the resin sealed area, and a metal pattern 24 is formed along the edges of the cavity 16 so as to surround the cavity 16 on the surface of the ceramic package body 12. The metal pattern 24 is a bleed-out-preventing metal pattern which prevents bleed-out of the sealing resin from the resin sealed area.

Figure 3:
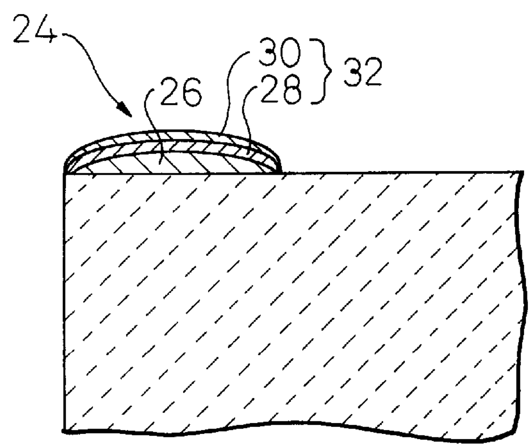
FIG. 3 is an enlarged cross-sectional view of the bleed-out-preventing metal pattern section in FIG. 2.

As shown in FIG. 3, this metal pattern 24 consists of a metallized layer 26 made of tungsten and formed integrally with the ceramic package body 12, and coated with a metal plating layer 32. The metal plating layer 32 is formed of a nickel layer 28 and a gold layer 30.

The thickness of the metallized layer 26 forming the metal pattern 24 is preferably at least 10 $\mu$m. Also, the respective thicknesses of the nickel layer 28 and gold layer 30 are preferably at least 1.5 $\mu$m for the nickel layer 28 and at least 0.3 $\mu$m for the gold layer 30, in order to adequately prevent bleed-out of the sealing resin filling the cavity 16 from out of the resin sealed area. The thickness of the gold layer need not have any particular restrictions, but from the standpoint of production costs, it is preferred that the thickness of the metallized layer 26 is no greater than 30 $\mu$m and that the respective thicknesses of the nickel layer 28 and gold layer 30 are no greater than 5 $\mu$m.

For formation of the metal pattern 24, when the ceramic package body 12 is produced by firing a green sheet, first tungsten is coated to a prescribed thickness by screen printing or the like in a frame shape at the locations which are to be the edges of the cavity 16, and it is then fired simultaneously with the ceramic package body 12, to form a frame-shaped metallized layer 26 along the edges of the cavity 16.

Next, the frame-shaped metallized layer 26 obtained by firing is used as one of the electrodes and a nickel layer 28 is formed on the metallized layer 26 by electrolytic nickel plating. A gold layer 30 is in turn formed on the nickel layer 28, by electrolytic gold plating, to form a metal pattern 24.

With the metal pattern 24 formed in this manner, it is possible to prevent bleed-out of the sealing resin filling the cavity 16 from out of the resin sealed area. Consequently, as shown in FIG. 5, after using bonding wires 22, 22 . . . to bond between the semiconductor pattern 20, 20 . . . and the electrode terminal of the CCD 14 mounted on the bottom of the cavity 16 formed in the ceramic package body 12, it is possible to accomplish resin sealing of the CCD 14, etc. with a transparent or semi-transparent resin. Even when the cavity is filled with a sealing resin by potting for the resin sealing, the sealing resin 27 is held in by the metal pattern 24 surrounding the cavity 16, and it is therefore possible to prevent bleed-out of the sealing resin 27 from the cavity 16 to the surface of the ceramic package body 12.

The resulting semiconductor device allows easier sealing of the CCD 14, and is lighter, compared to semiconductor devices wherein the CCD 14 is hermetically sealed with a cap fitted with a glass section.

The semiconductor device shown in FIG. 5 has a CCD mounted as the semiconductor element, but a normal semiconductor element may of course be mounted instead of the CCD.

Figure 6:
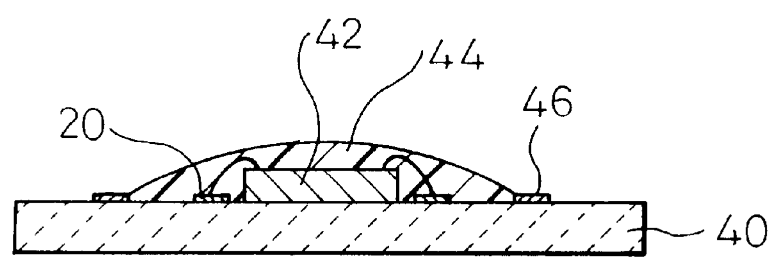
FIG. 6 is a cross-sectional view of another embodiment of a semiconductor device according to the invention.

As shown in FIG. 6, even when a ceramic base 40 is used as the ceramic package, and the semiconductor element 42 mounted on the flat surface of the ceramic base 40 is resin sealed with a sealing resin 44, bleed-out of the sealing resin 44 can be prevented by providing a bleed-out-preventing metal pattern 46 on the ceramic base 40 so as to surround the resin sealed area of the ceramic base 40. The bleed-out-preventing metal pattern 46 has the same construction as the bleed-out-preventing metal pattern 24 described above.

Figure 7:
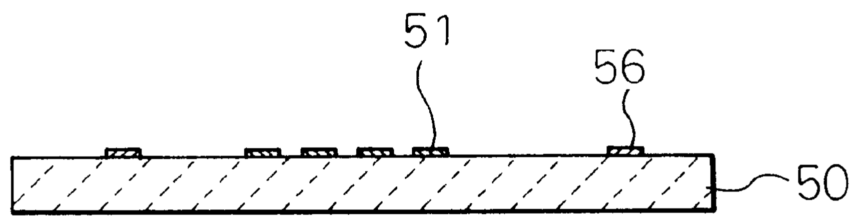
FIG. 7 is a cross-sectional view of another embodiment of a ceramic package according to the invention.
Figure 8:
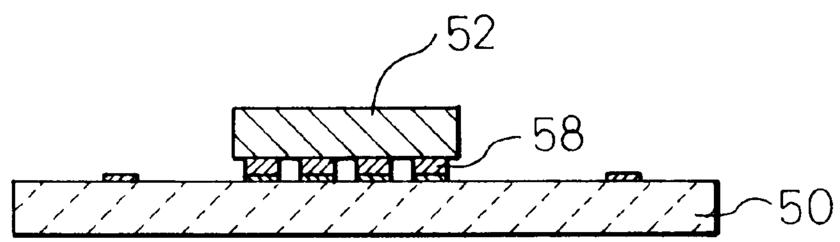
FIG. 8 is a cross-sectional view of the ceramic package in FIG. 7, with a semiconductor element mounted thereon.
Figure 9:
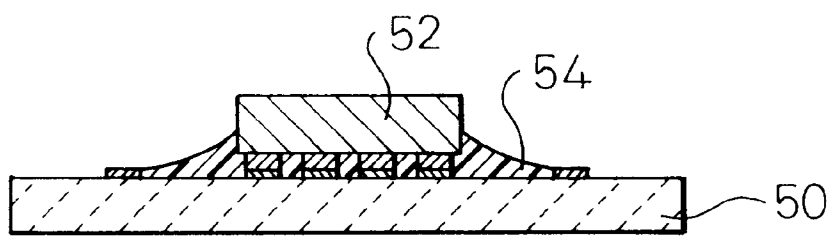
FIG. 9 is a cross-sectional view of a semiconductor device obtained by resin sealing the device of FIG. 8.
Figure 10:
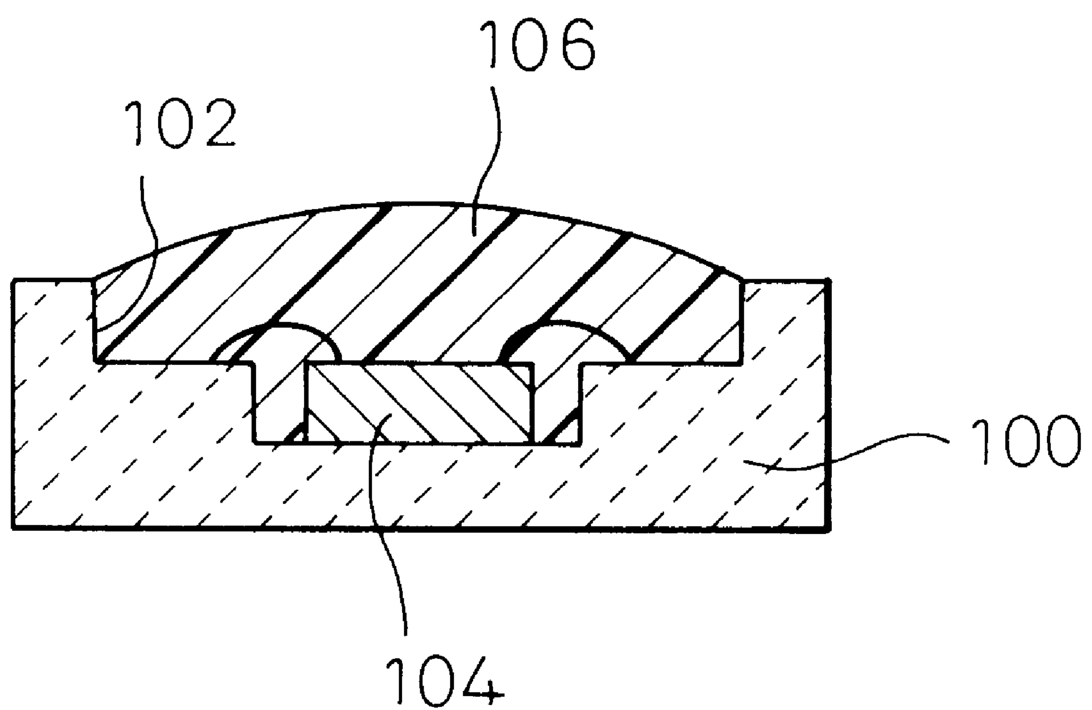
FIG. 10 is a cross-sectional view of a semiconductor device according to the prior art.

Alternatively, as shown in FIG. 7, a ceramic base 50 with a bleed-out-preventing metal pattern 56 formed thereon may be used with a conductor pattern 51 which connects bumps of a semiconductor element, and as shown in FIG. 8, the conductor pattern may be connected with the bumps 58 by mounting the semiconductor element 52 thereon, after which, as shown in FIG. 9, resin sealing may be accomplished with a sealing resin 54. In this case as well, the presence of the bleed-out-preventing metal pattern 56 can prevent bleed-out of the sealing resin 54. The construction of the bleed-out-preventing metal pattern 56 is the same as that of the metal pattern 24 described above.

The present invention will now be explained further by way of examples and comparative examples.

EXAMPLE 1

After layering a determined number of alumina green sheets of a prescribed shape, the sheets were fired and a ceramic package body 12 was made. The body 12 contained a cavity 16 and a CCD 14 was mounted therein. Here, after layering the determined number of green sheets with the prescribed shape, tungsten paste was applied by screen printing into a frame-shape at the locations forming the edges of the cavity 16, and the paste was fired simultaneously with the ceramic package body 12 to form a frame-shaped metallized layer 26 along the edges of the cavity 16. The thickness of the metallized layer 26 was 15 $\mu$m.

Next, to use of the fired frame-shaped metallized layer 26 as one of the electrodes, the metallized layer 26 was subjected to electrolytic nickel plating and electrolytic gold plating. The metal plating formed a nickel layer 28 to a thickness of 4.3 $\mu$m and a gold layer 30 to a thickness of 3.2 $\mu$m on the metallized layer 26 to complete the metal pattern 24, resulting in a ceramic package 10 as shown in FIG. 2.

Upon filling the cavity 16 of the resulting ceramic package 10 with a sealing resin (liquid epoxy resin) 27 by potting, the filled sealing resin 27 was completely held in by the metal pattern 24, so that absolutely no bleeding-out of the sealing resin 27 from the cavity was observed at the surface of the ceramic package 12.

The presence of bleed-out was judged by visual examination of the state of the sealing resin after it had been filled and allowed to stand for one hour.

COMPARATIVE EXAMPLE 1

Upon forming a frame-shaped metallized layer 26 along the edges of a cavity by firing simultaneously with a ceramic package body 12 in the manner of Example 1, but in this case filling the cavity 16 with the sealing resin 27 without metal plating of the metallized layer 26, bleeding-out of the sealing resin 27 was observed from the cavity 16 at the surface of the ceramic package body 12.

EXAMPLE 2

The thicknesses of the nickel layer 28 and gold layer 30 formed by electrolytic nickel plating and electrolytic gold plating on a fired frame-shaped metallized layer as in Example 1 were changed to those listed in Table 1 below and, upon filling of the sealing resin 27 in the same manner as Example 1, the condition of bleed-out of the sealing resin 27 was observed, giving the results also shown in Table 1.

TABLE 1

| | Au thickness | | | |
|---|---|---|---|---|
| Ni thickness | 0.3 μm | 0.5 μm | 1.0 μm | 1.5 μm |
| 1.0 μm | Δ–○ | Δ–○ | Δ–○ | Δ–○ |
| 1.2 μm | Δ–○ | ○ | ○ | ○ |
| 1.5 μm | ○ | ○ | ◎ | ◎ |
| 2.0 μm | ○ | ○ | ◎ | ◎ |

Notes:
Δ = Slight bleed-out observed, but within acceptable range
○ = Almost no bleed-out observed
◎ = Absolutely no bleed-out observed As shown in Table 1, which is based on SEM (Scanning Electron Microscope) photographs taken at a 40° angle with respect to the surfaces of the metal patterns 24 at each level, the metal plated crystals were found to have sufficient growth with adequately flat surfaces, at the levels where the Au thickness was at least 0.3 μm and the Ni thickness was at least 1.5 μm, as compared to the levels where the Ni thickness was less than 1.5 μm even when the Au thickness was at least 0.3 μm.

According to the invention, it is possible to industrially provide semiconductor devices with resin sealed semiconductor elements mounted on ceramic packages, to make possible light weight and low cost semiconductor devices employing ceramic packages.

What is claimed is:

1. A resin sealing ceramic package which is a resin sealing ceramic package for resin sealing of mounted semiconductor elements, characterized in that a bleed-out-preventing metal pattern designed to prevent bleed-out of the sealing resin used for said resin sealing from out of the resin sealing area, is formed on the surface of said ceramic package so as to surround said resin sealing area.

2. A resin sealing ceramic package according to claim 1, wherein the bleed-out-preventing metal pattern comprises a metal plating layer formed on a metallized layer made of a metal such as tungsten formed in a frame shape on the surface of the ceramic package, and is shaped so as to surround the resin sealing area.

3. A resin sealing ceramic package according to claim 1, wherein the bleed-out-preventing metal pattern comprises a metallized layer made of tungsten or the like formed in a frame shape on the surface of the ceramic package, and a metal plating layer consisting of a nickel layer and gold layer formed on the metallized layer, and is shaped so as to surround the resin sealing area.

4. A resin sealing ceramic package according to claim 3, wherein the thickness of the nickel layer is at least 1.5 μm and the thickness of the gold layer is at least 0.3 μm.

5. A semiconductor device which is a semiconductor device wherein a semiconductor element mounted on a ceramic base is resin sealed, characterized in that a bleed-out-preventing metal pattern designed to prevent bleed-out of the sealing resin used for said resin sealing from out of the resin sealing area, is formed on the surface of said ceramic package so as to surround the resin sealing area.

6. A semiconductor device according to claim 5, wherein the bleed-out-preventing metal pattern comprises a metal plating formed on a metallized layer made of tungsten or the like formed in a frame shape on the surface of the ceramic package, and is shaped so as to surround the resin sealing area.

7. A semiconductor device according to claim 6, wherein the bleed-out-preventing metal pattern comprises a metallized layer made of tungsten or the like formed in a frame shape on the surface of the ceramic package, and a metal plating layer consisting of a nickel layer and gold layer formed on the metallized layer, and is shaped so as to surround the resin sealing area.

8. A semiconductor device according to claim 7, wherein the thickness of the nickel layer is at least 1.5 μm and the thickness of the gold layer is at least 0.3 μm.

* * * * *

UNITED STATES PATENT AND TRADEMARK OFFICE
CERTIFICATE OF CORRECTION

PATENT NO. : 6,060,779

DATED : May 9, 2000

INVENTOR : Misuzu MACHII

It is certified that error appears in the above-identified patent and that said Letters Patent is hereby corrected as shown below:

On the title page, please insert the reference to the foreign application priority as follows:

--[30] Foreign Application Priority Data

Apr. 30, 1997 [JP] Japan .......................... 9-112336--.

Signed and Sealed this

Twentieth Day of February, 2001

Attest:

Nicholas P. Godici

NICHOLAS P. GODICI

*Attesting Officer* *Acting Director of the United States Patent and Trademark Office*